United States Patent
Kohli et al.

(10) Patent No.: US 7,960,238 B2
(45) Date of Patent: Jun. 14, 2011

(54) MULTIPLE INDIUM IMPLANT METHODS AND DEVICES AND INTEGRATED CIRCUITS THEREFROM

(75) Inventors: Puneet Kohli, Austin, TX (US); Manoj Mehrotra, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 214 days.

(21) Appl. No.: 12/344,843

(22) Filed: Dec. 29, 2008

(65) Prior Publication Data

US 2010/0164003 A1 Jul. 1, 2010

(51) Int. Cl.
*H01L 21/336* (2006.01)

(52) U.S. Cl. ........ 438/305; 438/300; 438/301; 438/303; 438/306

(58) Field of Classification Search .............. 438/300, 438/301, 303, 305, 306
See application file for complete search history.

(56) References Cited

U.S. PATENT DOCUMENTS

| | | | | |
|---|---|---|---|---|
| 6,500,739 | B1 * | 12/2002 | Wang et al. | 438/514 |
| 6,555,437 | B1 | 4/2003 | Yu | |
| 7,105,413 | B2 * | 9/2006 | Nahm et al. | 438/305 |
| 7,226,843 | B2 | 6/2007 | Weber et al. | |
| 2004/0099890 | A1 * | 5/2004 | Umimoto et al. | 257/288 |
| 2004/0142520 | A1 * | 7/2004 | Mouli | 438/197 |
| 2004/0188767 | A1 * | 9/2004 | Weber et al. | 257/369 |

* cited by examiner

*Primary Examiner* — Matthew Smith
*Assistant Examiner* — John M Parker
(74) *Attorney, Agent, or Firm* — Warren L. Franz; Wade J. Brady, III; Frederick J. Telecky, Jr.

(57) ABSTRACT

An integrated circuit (IC) includes at least one NMOS transistor, wherein the NMOS transistor includes a substrate having a semiconductor surface, and a gate stack formed in or on the surface including a gate electrode on a gate dielectric, wherein a channel region is located in the semiconductor surface below the gate dielectric. A source and a drain region are on opposing sides of the gate stack. An In region having a retrograde profile is under at least a portion of the channel region. The retrograde profile includes (i) a surface In concentration at a semiconductor surface interface with the gate dielectric of less than $5\times10^{16}$ cm$^{-3}$, (ii) a peak In concentration at least 20 nm from the semiconductor surface below the gate dielectric, and wherein (iii) the peak In concentration is at least two (2) orders of magnitude higher than the In concentration at the semiconductor surface interface. A method to form an IC including at least one NMOS transistor includes implanting a first In implant at a first energy and a second In implant at a second energy, wherein the first In implant together with the second In implant form an In region having a retrograde profile under at least a portion of the channel region, and wherein the second energy is at least 5 keV more than the first energy.

19 Claims, 5 Drawing Sheets

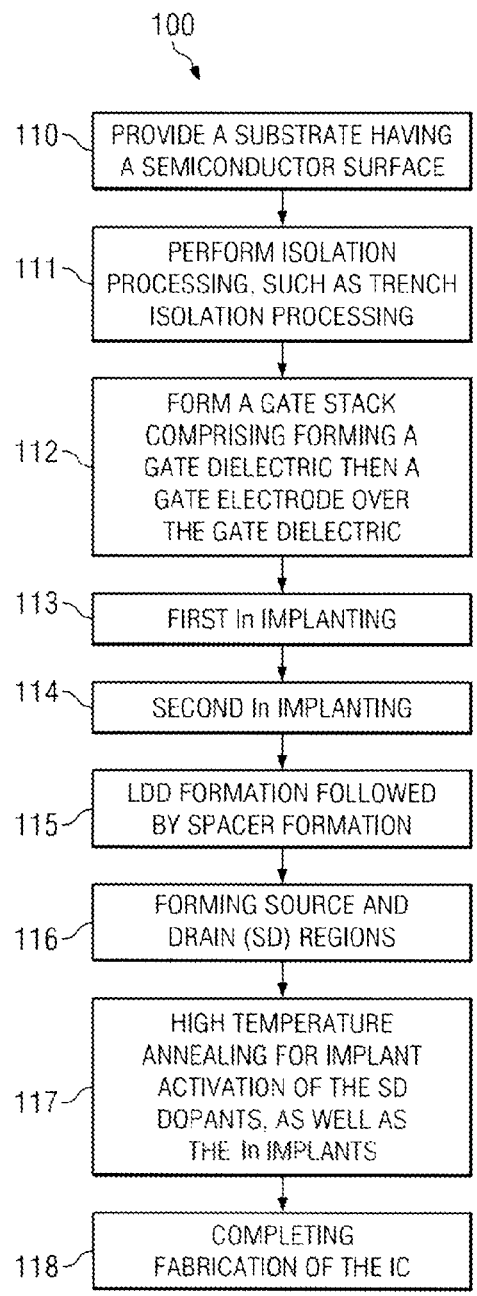
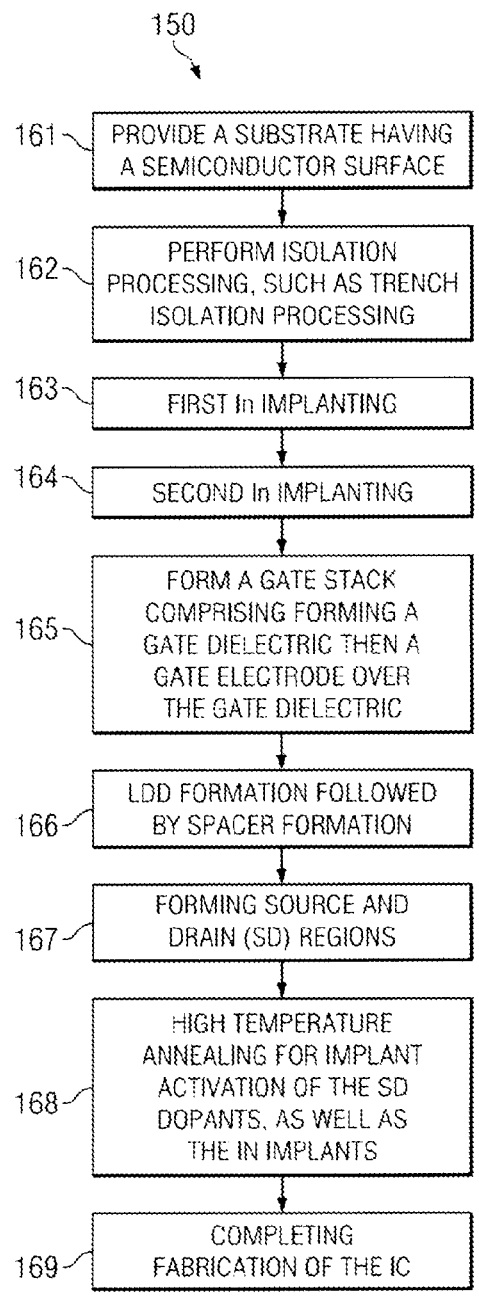
FIG. 1A
FIG. 1B

MULTIPLE INDIUM IMPLANT METHODS AND DEVICES AND INTEGRATED CIRCUITS THEREFROM

FIELD OF THE INVENTION

Embodiments of the present invention relate to methods for manufacturing MOS devices and integrated circuits (ICs) therefrom, more particularly to NMOS devices that include Indium implants under at least a portion of the channel region of the device.

BACKGROUND

The field effect transistor (FET) is a common element of an IC. In general, when fabricating multiple FETs of similar size, it is desired that a performance characteristic such as threshold voltage (Vt) be matched between devices. In general, the Vt tends to decrease in response to reduced gate length. As gate electrode lengths approach dimensions less than 100 nanometers (nm), what is seen is that the Vt drops off or decreases rapidly. Therefore, even a small change in the gate electrode length (e.g., a 10 nanometer difference from a targeted length), can significantly affect the Vt.

Ideally, the Vt should be constant over a range of gate lengths about a target gate length to account for manufacturing margins. To promote a more constant Vt over a range of acceptable gate lengths, locally implanted dopants (p-type for NMOS devices and n-type dopants in PMOS devices) may be introduced under the gate edges. Such implants are referred to as "halo" or "pocket" (hereafter "halo") implants. The implanted dopant tends to raise the dopant concentration around the edges of the channel, thereby increasing the Vt. One effect is to reduce the Vt of the target size device while maintaining the Vt of the worst case size device.

Typical halo implants for NMOS devices generally include boron (e.g., by implanting boron fluoride ($BF_2$)), or indium (In)). Halo implants for PMOS devices generally include arsenic, antimony, and phosphorous. With respect to NMOS devices, In can be a particularly effective dopant because In generally forms a retrograde profile from the surface of the device. Such a concentration profile with respect to In tends to decrease the threshold voltage required to meet a given leakage current (Ioff) relative to a device having a boron dopant which does not provide the same retrograde profile.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

The Present Inventors have realized a problem with using In for NMOS devices is that In achieves a state of solid solubility at a point below the concentration required to generally reach worst case leakage currents. Thus, to target small leakage currents (e.g., on the order of 40 nanoamps (na)) at an NMOS device sizes less than about 100 nanometers (nm)), a single In implant cannot generally reach such targets.

Embodiments of the invention describe multiple In implant methods for forming In doped regions having retrograde profiles that can be used as either Vt implants (globally in the channel) or halo implants (only the outer edges of the channel). The surface doping in the In regions is kept low to reduce impurity scattering, but, below the surface, there is relatively heavy In doping, generally across a depth range that is significantly greater than the achievable depth range obtainable using a single In implant, which has been found by the Present Inventors to achieve higher Vt and reduced short-channel effects (SCE). For example, the retrograde In profile can comprise a surface In concentration at the semiconductor surface interface with the gate dielectric of less than $5 \times 10^{16}$ $cm^{-3}$, and a peak In concentration that is at least 20 nm from the semiconductor surface interface that provides an In concentration that is at least two (2) and generally at least three (3) orders of magnitude higher than the In concentration at the semiconductor surface interface.

BRIEF DESCRIPTION OF THE DRAWINGS

FIG. 1A shows steps in a first exemplary method for fabricating an IC including at least one NMOS transistor that includes a plurality of In halo implants, according to an embodiment of the invention.

FIG. 1B shows steps in a second exemplary method for fabricating an IC including at least one NMOS transistor that includes a plurality of In Vt (globally in the channel) implants.

DETAILED DESCRIPTION

Figure 2:
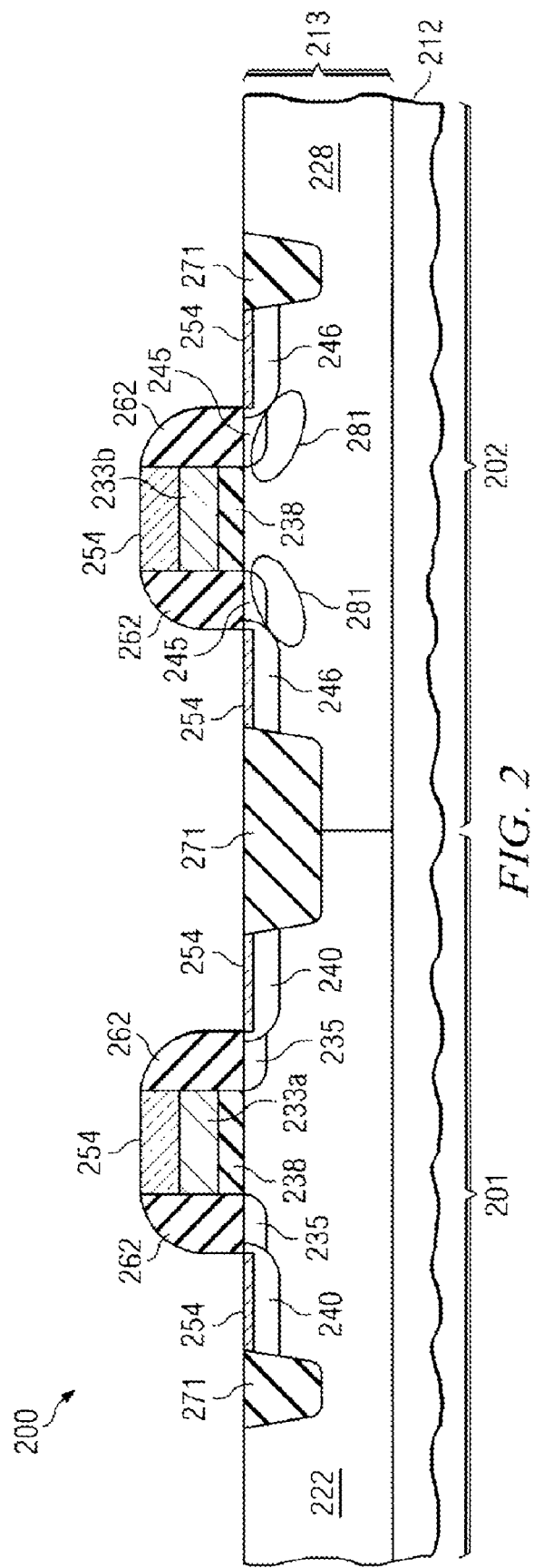
FIG. 2 is a cross sectional view of an IC including a PMOS and an NMOS transistor, with the NMOS transistors having In halo implanted regions formed from multiple In implants, according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

One embodiment of the invention comprises a method of fabricating IC including at least one NMOS transistor using multiple In Vt or halo implants. The energy of the In implants are generally in a range between 60 and 100 keV. As used herein, multiple In implants refers to two (2) or more In implants that are performed at energies that range in energy by $\geq$10 Kev. For example, a three In implant process can comprise In implants at 60 keV, 70 keV and 90 keV. The NMOS transistor comprises a source and a drain region on opposite sides of a gate stack which comprises a gate electrode on a gate dielectric, wherein a channel region is under the gate stack. The NMOS transistor has an In region that has a retrograde profile under at least a portion of the channel region.

FIG. 1A shows steps in a first exemplary method 100 for fabricating an IC including at least one NMOS transistor that includes a plurality of In halo implants. In step 110, a substrate having a semiconductor surface is provided. For example, the substrate can be a conventional bulk semiconductor substrate, or a semiconductor on insulator (SOI) substrate. Step 111 comprises isolation processing, such as trench isolation. Step 112 comprises forming a gate stack comprising forming a gate dielectric then a gate electrode over the gate dielectric. The gate dielectric layer can be, for example but not limited to, silicon oxide, silicon nitride, or silicon-oxy nitride (SiON), or a high-k gate dielectric that generally has a k-value >10. The gate electrode layer can be, for example, polysilicon.

Step 113 comprises a first In implant (also referred to as the "shallower" In implant) at a first energy that is between 60 and 95 keV and is generally between 60 and 80 keV, at a dose that is generally between $1\times10^{13}$ cm$^{-1}$ to $1\times10^{14}$ cm$^{-2}$. PMOS devices are generally masked, such as using a resist pattern, to prevent receiving In. In step 114, a second In implant is performed. The second In implant (also referred to as the "deeper" In implant) is at a higher energy relative to the first In implant, such as at least 5 keV and generally at least 10 keV more, being in an energy range from 65 to 100 keV, generally being in the range from 80 to 100 keV. The implant angle can generally be from 0 to 45 degrees.

No annealing cycle to activate the shallower In implant, such as at a temperature of 800° C. or more, is generally performed before the deeper In implant. Moreover, the same masking pattern, such as a resist pattern, is generally used for both In implants in the case of a two (2) implant process, or more generally all In implants (such as for processes having three (3) or more In implants). Implanting the deeper In implant (step 114) after the shallower In implant (step 113) without annealing the implant damage to the crystal from the first In implant has been found by the Present Inventors to generally significantly reduce undesirable channeling of the deeper In implant.

Step 115 comprises LDD formation followed by spacer formation. Step 116 comprises forming source and drain (SD) regions. Step 117 comprises high temperature annealing for implant activation of the SD dopants, as well as the In implants. Step 117 can comprise an advanced annealing cycle that minimizes the DT, such as a rapid thermal anneal (RTA), flash or laser anneal. Such advanced annealing provides the high temperature need for implant activation and crystal repair, without significant time at the high temperature to result in significant dopant diffusion. Step 118 comprises completing fabrication of the IC.

Step 118 comprises completing fabrication of the IC and can comprise metal silicide layer formation on the gate electrode in the case of a polysilicon gate electrode and on the SD regions, and conventional back end of the line (BEOL) processing including multi-layer damascene metallization and then passivation. The metal silicide layer can be, for example, made of tungsten silicide, titanium silicide, cobalt silicide, molybdenum silicide, nickel silicide, palladium silicide, platinum silicide or other well-known material. The method for forming the metal silicide layer can be, for example, a self-aligned metal silicide process. In one embodiment, step 118 includes replacement gate processing. As known in the art, replacement gate processing allows metal gates to be provided for one or both PMOS and NMOS transistors.

FIG. 1B shows steps in a second exemplary method 150 for fabricating an IC including at least one NMOS transistor that includes a plurality of In Vt (globally in the channel) implants. Method 150 can include steps 110 and 111 described above, renumbered herein as steps 161 and 162 for method 150. In the case of Vt implanting, the first (shallower) In implant and then the second (deeper) In implant are performed before the gate stack is completed, either before or after formation of the gate dielectric, but generally before the formation of the gate electrode. Method 150 will be described in the embodiment where the In implants are performed before the gate dielectric is formed, with the understanding the multiple In implants can be performed after the gate dielectric is formed (and through the gate dielectric).

Step 163 comprises a first (shallower) In implant that is analogous to step 113 described above. PMOS devices are generally masked, such as with resist, to prevent receiving In. Step 164 comprising a second (deeper) In implant that is analogous to step 114 described above. As described above, no annealing cycle, such as at 800° C. or above, is generally performed between the respective In implants, and the same masking pattern (e.g. resist pattern) is generally used for both In implants. Step 165 comprises forming a gate stack comprising forming a gate dielectric then a gate electrode over the gate dielectric which is analogous to step 112 described above. Step 166 comprises LDD formation followed by spacer formation analogous to step 115. Step 167 comprises forming SD regions and is analogous to step 116. Step 168 comprises high temperature annealing for implant activation of the SD dopants, as well as the In implants, and is analogous to step 117. Finally, step 169 comprises completing fabrication of the IC including the NMOS transistor, analogous to step 118 described relative to method 100.

Although not described above, methods according to embodiments of the invention can utilize a sacrificial gate stack, where the final gate stack is formed last, and the LDD, In implants for NMOS, and SD implantation/anneal are performed using a sacrificial gate stack. Moreover, methods according to embodiments of the invention can also include carbon (C) implants that are known to assist with Indium (In) activation for either halo or Vt In implants. C can be implanted after formation of the gate electrode as part of the LDD processing.

FIG. 2 is a cross sectional view of an IC 200 including a PMOS transistor 201 and an NMOS transistor 202, with the NMOS device 202 having dual In halo implanted regions each shown as 281, according to an embodiment of the invention. IC 200 comprises a substrate 212 having a semiconductor surface 213. Trench isolation 271 is shown. An Nwell 222 and a Pwell 228 are formed in the semiconductor surface 213. A gate stack for both PMOS device 201 and NMOS device 202 are formed in or on the surface 213. PMOS device 201 comprises gate electrode 233a such as P+ doped polysilicon and NMOS device 202 comprises gate electrode 233b such as N+ doped polysilicon, collectively referred to as gate electrode 233. A silicide layer 254 is shown on gate electrode 233 and a gate dielectric 238 is shown beneath the gate electrode 233, wherein a channel region is located in the semiconductor surface below the gate dielectric 238 for both PMOS device 201 and an NMOS device 202. A spacer 262 is on the sidewalls of each gate stack 254/233/238.

PMOS device 201 includes SD regions 240 positioned on opposing sides of the gate stack 254/233a/238. PMOS device 201 also includes SD extension (LDD) regions 235 positioned between the SD regions 240 and the channel region of PMOS device 201.

NMOS device 202 includes SD regions 246 positioned on opposing sides of the gate stack 254/233b/238. NMOS device 202 includes LDD regions 245 positioned between the SD regions 246 and the channel region of NMOS device 202. The In halo regions for NMOS device 202 are shown as 281.

Halo region 281 has a retrograde profile that comprises a surface In concentration that is less than $5 \times 10^{16}$ cm$^{-3}$, and a peak concentration at a location that is at least 20 nm from the surface interface with the gate dielectric that is at least two (2) orders of magnitude higher, and is generally at least three (3) orders of magnitude higher, as compared to the In concentration at the surface interface. The surface interface doping is kept low at less than $5 \times 10^{16}$ cm$^{-3}$ to reduce impurity scattering, but, below the surface, there is relatively heavy In doping that is at least two (2) orders of magnitude higher to achieve higher Vt and reduced short-channel effects (SCE) for NMOS device 202 (see exemplary In concentration profile shown in FIGS. 3A and 3B described below in the Examples). Moreover, as described above, C can also be included in the In regions 281, generally in a minimum concentration of at least $1 \times 10^{18}$ cm$^{-3}$.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

EXAMPLES

The following non-limiting Examples serve to illustrate selected embodiments of the invention. It will be appreciated that variations in proportions and alternatives in elements of the components shown will be apparent to those skilled in the art and are within the scope of embodiments of the present invention.

Figure 3A:
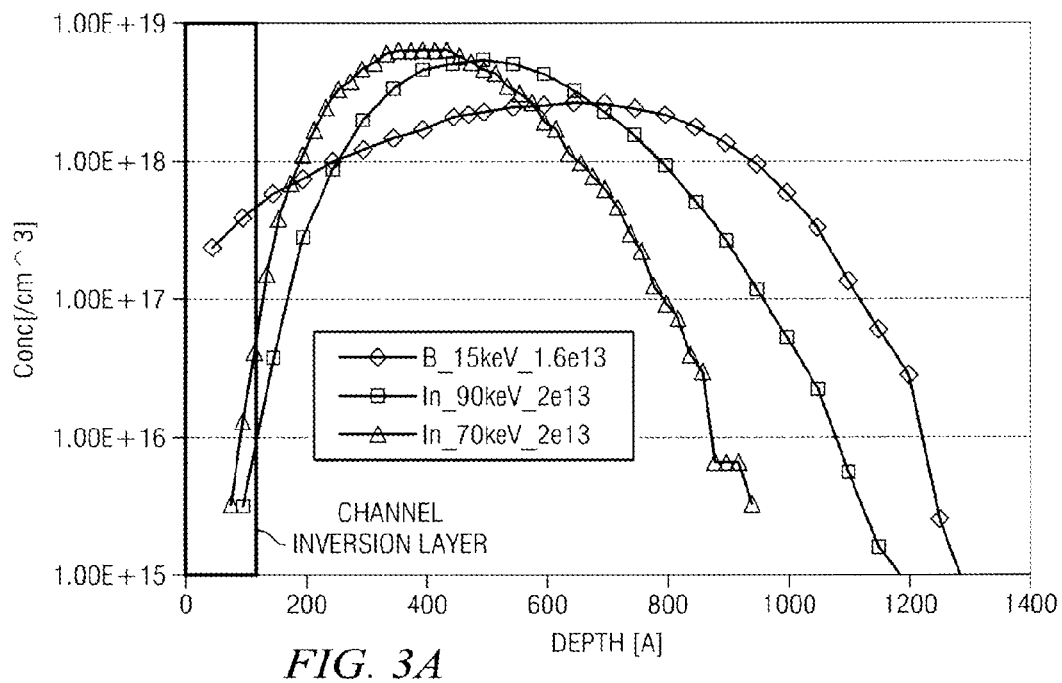
FIG. 3A shows as implanted In profiles into silicon for an exemplary first (shallower) In implant and second (deeper) In implant according to an embodiment of the invention.

FIG. 3A shows as implanted In profiles into silicon for an exemplary first (shallower) In implant (dose $2.0 \times 10^{13}$ cm$^{-2}$ at 70 keV) and second In implant (dose $2.0 \times 10^{13}$ cm$^{-2}$ at 90 keV) according to an embodiment of the invention. Using the advanced anneals described above such as RTA, flash or laser anneals, which all generally provide a high temperature (e.g. 950 to 1050° C.) for a very short time (e.g. <10 seconds at the high temperature) the final In profiles in the completed NMOS devices are expected to remain significantly similar to the as-implanted In profiles shown in FIG. 3A.

The as implanted profile for a conventional B implant (dose $1.6 \times 10^{13}$ cm$^{-2}$ at 15 keV) is also shown. As known in the art, BF$_2$ may be implanted instead of B if the implant energy is suitably adjusted. The doping in the In comprising regions according to embodiments of the invention generally also include a B (or BF$_2$) Vt implant in a dose range from $5 \times 10^{11}$ to $1 \times 10^{13}$ cm$^{-2}$. However, certain low voltage NMOS devices on the IC according to an embodiment of the invention may exclude the B (or BF$_2$) Vt implant.

The profiles shown assume that no channeling occurs. As described above, implanting the shallower In implant before the deeper In implant without an intervening annealing cycle reduces the possible channeling of the deeper In implant. Moreover, as described above, the first and second In implants combined reduce the In solid solubility problem described above by spreading the highly doped In across a wider range of depths as compared to the range of depths achievable with a single In implant, allowing ICs according to embodiments of the invention to generally reach required worst case NMOS leakage currents. For example, the In distributions have been found to allow attainment of small NMOS leakage currents (e.g., on the order of 40 nanoamps (na) at device sizes less than 100 nanometers (nm)), for which a single In implant cannot generally provide.

Figure 3B:
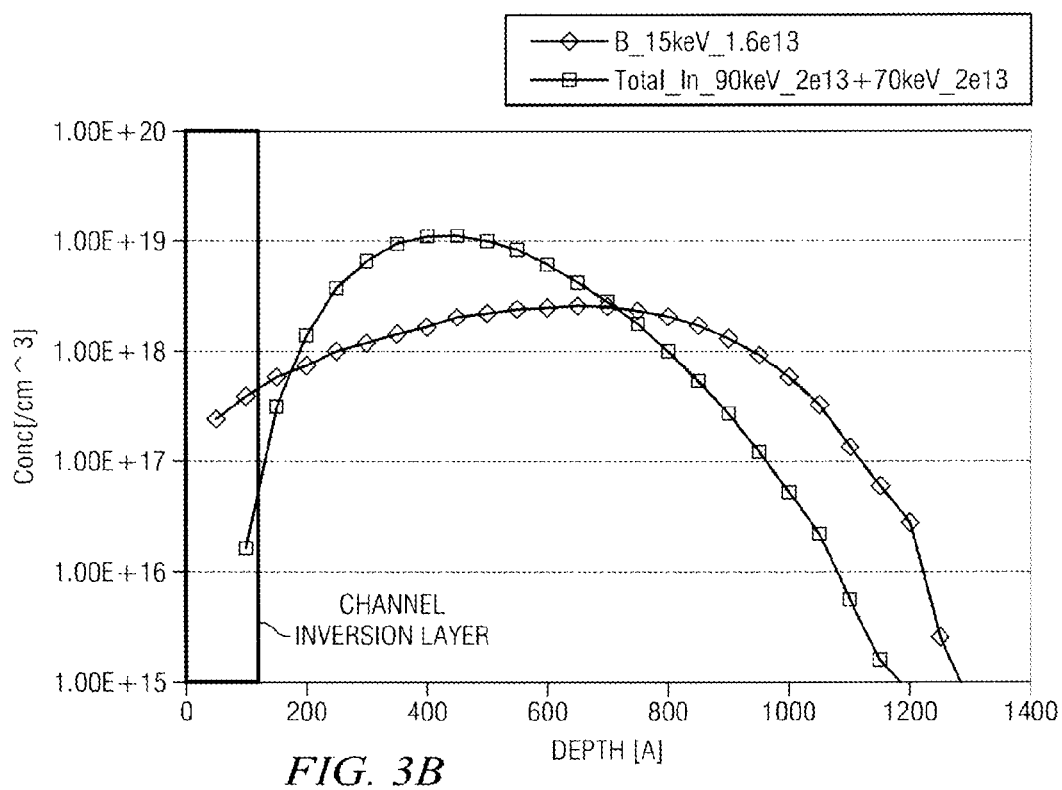
FIG. 3B shows a combined as implanted In implant profile derived from summing the respective In implant profiles shown in FIG. 3A.

As known in the art, the resulting distribution for multiple overlapping distributions can be found by superposition of the respective profiles. FIG. 3B shows a combined as implanted In implant profile derived from summing the respective In implant profiles shown in FIG. 3A. It can be seen from FIG. 3B that the combined profiles yield an In surface concentration $\ll 5.0 \times 10^{16}$ cm$^{-3}$, and a maximum In concentration that appears fairly constant at around $1.0 \times 10^{19}$ cm$^{-3}$ across a depth range from about 400 to 550 Angstroms from the surface. The surface In concentration is seen to be clearly be at least 2 orders of magnitude, and generally at least about 3 orders of magnitude below the peak In concentration shown. As described above, by keeping the surface doping in the In regions low impurity scattering is reduced, but, below the surface, there is much heavy In doping across a depth range that is significantly greater than the achievable depth using a single In implant (see FIG. 3A), thus achieving higher Vt and reduced short-channel effects (SCE).

Figure 4A:
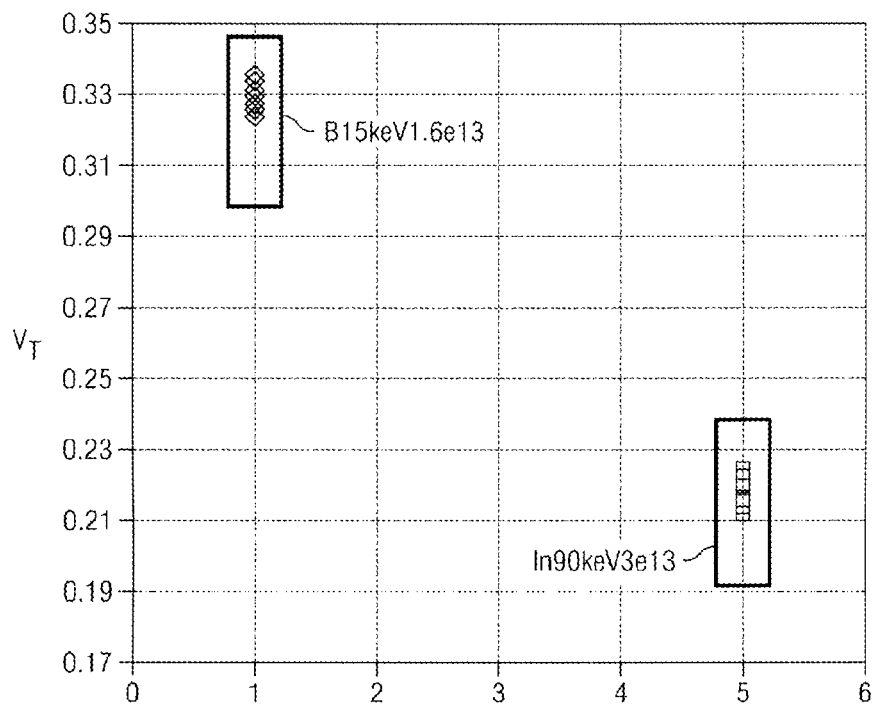
FIG. 4A and FIG. 4B show the difference in Vt for NMOS devices having a single In Vt implant as compared to and first and second dual In Vt implants according to an embodiment of the invention, respectively, as compared to a device having a baseline boron Vt implant.
Figure 4B:
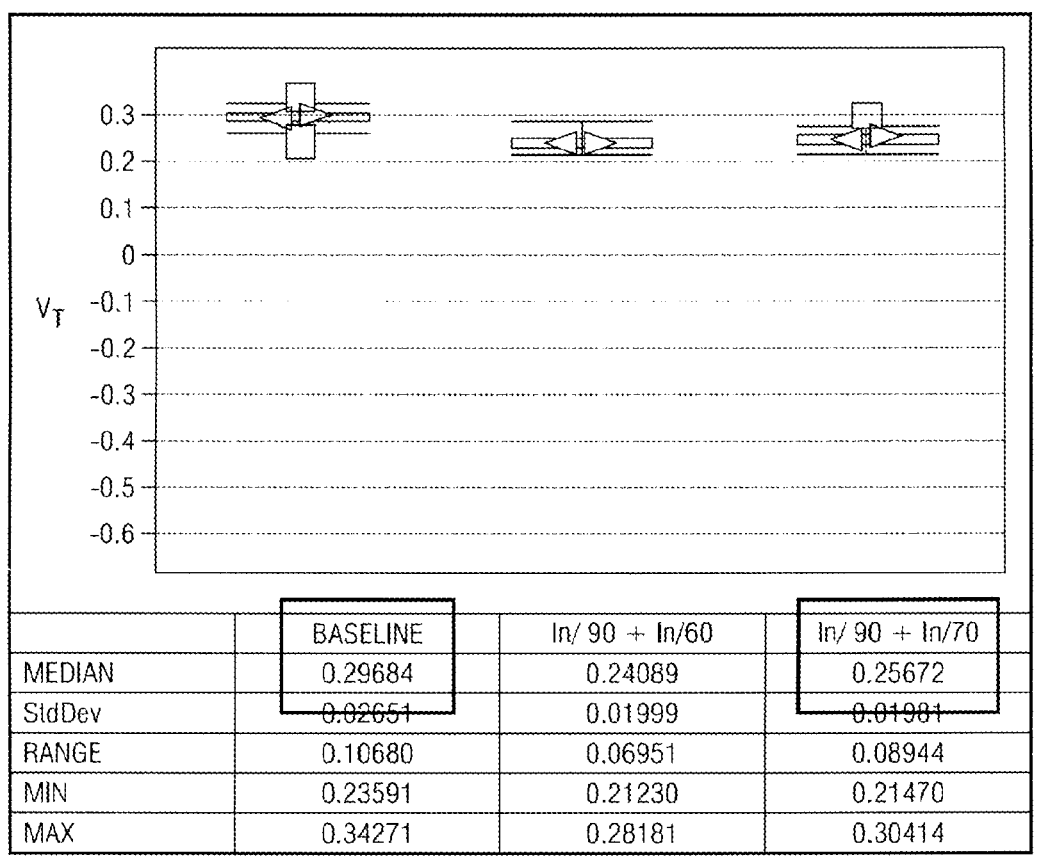

FIG. 4A and FIG. 4B show the difference in Vt for NMOS devices having Lg=65 nm having various Vt implants. The devices tested included Vt implants comprising a $^{11}$B Vt implant dose of $1.6 \times 10^{13}$ cm$^{-2}$ at 15 keV (used as a baseline), a single In Vt implant dose of $3 \times 10^{13}$ cm$^{-2}$ at 90 keV, and a first and second exemplary dual In Vt implants according to embodiments of the invention. The first dual In Vt implant comprised an In implant dose of $2 \times 10^{13}$ cm$^{-2}$ at 90 keV and dose of $2 \times 10^{13}$ cm$^{-2}$ at 60 keV, while the second dual In Vt implant comprised an In implant dose of $2 \times 10^{13}$ cm$^{-2}$ at 90 keV and dose of $2 \times 10^{13}$ cm$^{-2}$ at 70 keV. The anneal was a 1050° C. RTA spike anneal followed by a laser anneal at 1235° C. for 1 msec. The results for the single In implant shown in FIG. 4A was found to have a Vt difference of about 110 mV as compared to the device having the baseline boron implant. FIG. 4B shows the first and second dual In Vt implants according to embodiments of the invention having a Vt difference of only 40 mV as compared to the device having the baseline boron implant. This example demonstrates the advantageous higher Vt provided by dual In Vt implants according to embodiments of the invention as compared to single In Vt implants.

Figure 5:
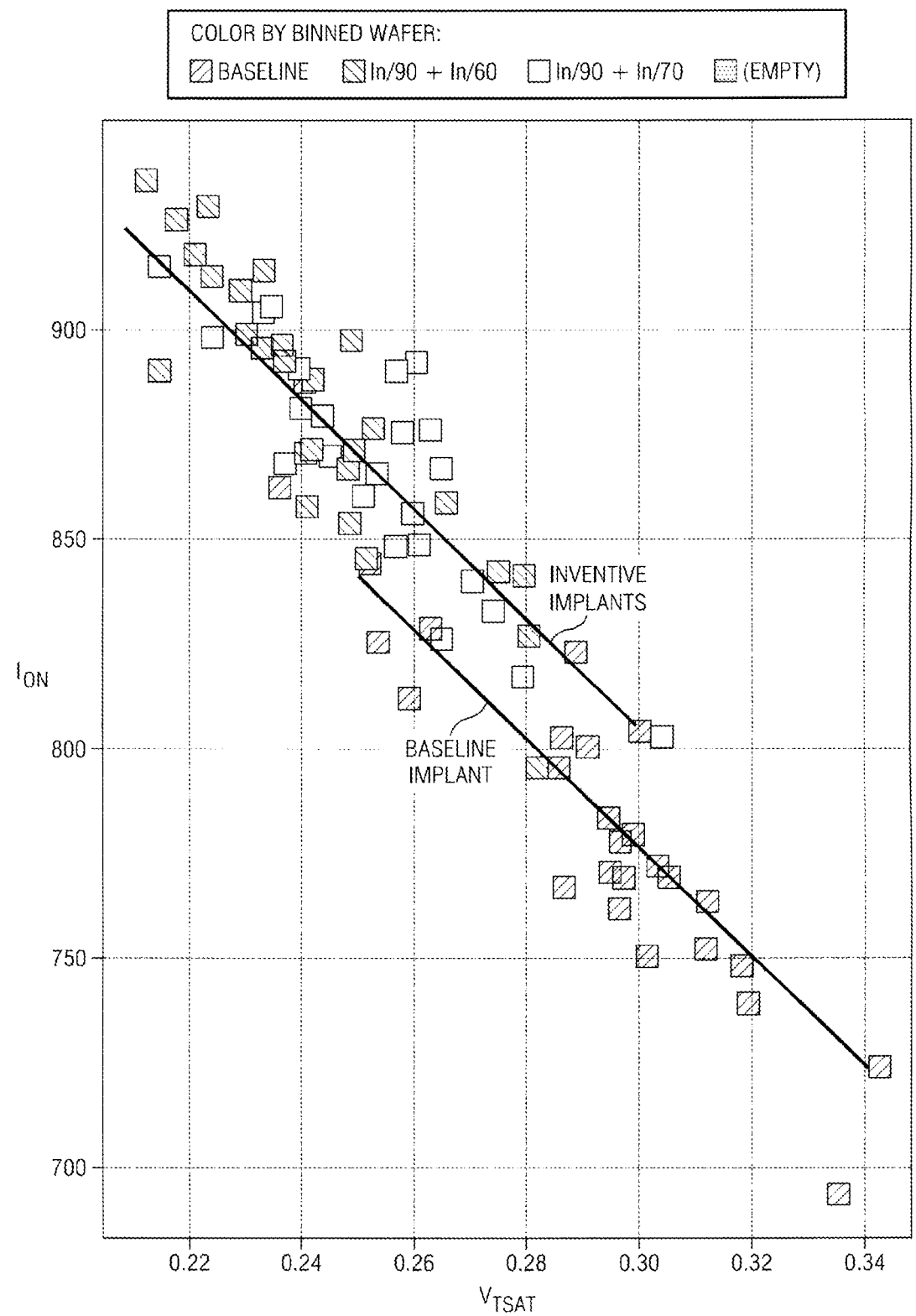
FIG. 5 shows the On state current (Ion) vs. Vtsaturation for a first NMOS devices having only the baseline Vt implant, and a second and third NMOS device having the first and second dual In Vt implants according to an embodiment of the invention.

FIG. 5 shows the on state current (Ion) vs. saturation voltage (Vtsat) for a first NMOS device having only a baseline boron implant described above, a second and third NMOS device having the first and second dual In Vt implants described above relative to FIGS. 4A and B. The results obtained show higher Ion for a given Vtsat with the devices having dual In Vt implants according to an embodiment of the invention as compared to the devices receiving only the baseline boron Vt implant.

While various embodiments of the present invention have been described above, it should be understood that they have been presented by way of example only, and not limitation.

Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A method for manufacturing an integrated circuit including an NMOS transistor, comprising:
    providing a substrate having a semiconductor surface;
    forming a gate stack comprising forming a gate dielectric then a gate electrode on said gate dielectric, wherein a channel region is located in said semiconductor surface below said gate stack;
    implanting a first In implant at a first energy;
    after said first In implant, implanting a second In implant at a second energy, wherein said first In implant together with said second In implant form an In region having a retrograde profile under at least a portion of said channel region, and further wherein said second energy is at least 5 keV more than said first energy; and
    forming source and drain regions;
    wherein said method is exclusive of any annealing at 800° C. or more between said first In implant and said second In implant;
    wherein said first In implant and said second In implant are both performed before forming said gate stack; and
    further wherein said In region covers an entire length of said channel region.

2. The method of claim 1, further comprising applying a resist pattern before said first In implant, wherein said first In implant and said second In implant are both performed using said resist pattern.

3. The method of claim 1, wherein said first energy and said second energy are both between 60 and 100 keV.

4. The method of claim 3, wherein a dose for said first In implant and a dose for said second In implant are both between $1 \times 10^{13}$ cm$^{-2}$ and $3 \times 10^{13}$ cm$^{-2}$.

5. A method for manufacturing an integrated circuit including an NMOS transistor, comprising:
    providing a substrate having a semiconductor surface;
    forming a gate stack comprising forming a gate dielectric then a gate electrode on said gate dielectric, wherein a channel region is located in said semiconductor surface below said gate stack;
    implanting a first In implant at a first energy;
    after said first In implant, implanting a second In implant at a second energy, wherein said first In implant together with said second In implant form an In region having a retrograde profile under at least a portion of said channel region, and further wherein said second energy is at least 5 keV more than said first energy; and
    forming source and drain regions;
    wherein said method is exclusive of any annealing at 800° C. or more between said first In implant and said second In implant; and
    wherein said In region comprises:
        (i) a surface In concentration below said gate dielectric that is less than $5 \times 10^{16}$ cm$^{-3}$;
        (ii) a peak In concentration at least 20 nm from said semiconductor surface below said gate dielectric, and
        (iii) said peak In concentration being at least two orders of magnitude higher than said In concentration at said semiconductor surface immediately below said gate dielectric.

6. A method for manufacturing an integrated circuit including an NMOS transistor and a PMOS transistor, comprising:
    providing a substrate having a semiconductor surface;
    forming a gate stack for each of said NMOS and PMOS transistors, comprising forming a gate dielectric then a gate electrode on said gate dielectric, wherein a channel region is located in said semiconductor surface below said gate stack;
    for said NMOS transistor only, implanting a first In implant at a first dose and a first energy; and
    for said NMOS transistor only, after said first In implant, implanting a second In implant at a second dose and a second energy, wherein said first dose and said second dose are both between $1 \times 10^{13}$ cm$^{-2}$ and $3 \times 10^{13}$ cm$^{-2}$ and said first energy and said second energy are both between 60 keV and 100 keV, and further wherein said second energy is at least 5 keV more than said first energy, said first In implant together with said second In implant forming an In region having a retrograde profile under at least a portion of said channel region; and
    forming source and drain regions for each of said NMOS and PMOS transistors;
    wherein said method is exclusive of any annealing at 800° C. or more between said first In implant and said second In implant.

7. The method of claim 6, wherein said first In implant and said second In implant are both performed before forming said gate stack, further wherein said In region covers an entire length of said channel region for said NMOS transistor.

8. The method of claim 6, wherein said first In implant and said second In implant are both performed after forming said gate stack for said NMOS transistor, further wherein said In region covers less than an entire length of said channel region for said NMOS transistor.

9. The method of claim 6, wherein said first In implant and said second In implant are both performed before forming said gate electrode for said NMOS transistor.

10. The method of claim 6, wherein said In region covers an entire length of said channel region for said NMOS transistor.

11. A method for manufacturing an integrated circuit including an NMOS transistor and a PMOS transistor, comprising:
providing a substrate having a semiconductor surface;
forming a gate stack comprising forming a gate dielectric then a gate electrode on said gate dielectric, wherein a channel region is located in said semiconductor surface below said gate stack;
prior to forming said gate electrode and with said PMOS transistor masked against implant, performing a first halo implant including implanting In at a first energy; and
after performing said first halo implant, performing a second halo implant including implanting In implant at a second energy different by at least 5 keV from said first energy, wherein said second halo implant is performed without any annealing at 800° C. or more after said first halo implant and wherein said first and second halo implants together form an In implant region having a retrograde profile under at least a portion of said channel region.

12. The method of claim 11, wherein said second halo implant is also performed prior to forming said gate electrode.

13. The method of claim 12, wherein said first and second halo implants are performed using a same mask.

14. The method of claim 13, wherein said second energy is higher than said first energy by at least 10 keV.

15. The method of claim 14, wherein said first energy is between 60 and 80 keV and said second energy is in a range from 80 to 100 keV.

16. The method of claim 15, wherein said retrograde profile comprises a surface In concentration that is less than $5\times10^{16}$ cm$^{-3}$ and a peak concentration at a location that is at least 20 nm from a surface interface with the gate dielectric that is at least $1\times10^{19}$ cm$^{-3}$.

17. The method of claim 16, further comprising a C implant into the In implant region.

18. The method of claim 17, wherein the C implant has a minimum concentration of $1\times10^{18}$ cm$^{-3}$.

19. The method of claim 18, further comprising performing source and drain implants, and annealing to activate the In implants following performing the source and drain implants.

* * * * *